(12) United States Patent
Kim

(10) Patent No.: US 7,369,414 B2
(45) Date of Patent: May 6, 2008

(54) ROTATABLE HINGE MECHANISM WITH ENCLOSURE FOR HOUSING FLEXIBLE PRINTED CIRCUIT

(75) Inventor: Woo-Jin Kim, Incheon (KR)

(73) Assignee: LG Electronics Inc., Seoul (KR)

( * ) Notice: Subject to any disclaimer, the term of this patent is extended or adjusted under 35 U.S.C. 154(b) by 674 days.

(21) Appl. No.: 10/292,690

(22) Filed: Nov. 12, 2002

(65) Prior Publication Data

US 2003/0095390 A1    May 22, 2003

(30) Foreign Application Priority Data

Nov. 16, 2001  (KR) .......................... 2001-0071478

(51) Int. Cl.
  *H05K 5/00*  (2006.01)
  *H05K 5/04*  (2006.01)
  *H05K 5/06*  (2006.01)

(52) U.S. Cl. ...................... 361/752; 361/753; 361/814; 361/685

(58) Field of Classification Search ........ 361/681–685, 361/752–756; 16/340–342
See application file for complete search history.

(56) References Cited

U.S. PATENT DOCUMENTS

| | | | |
|---|---|---|---|
| 5,027,394 A * | 6/1991 | Ono et al. ................ 379/434 |
| 5,581,440 A * | 12/1996 | Toedter ..................... 361/683 |
| 5,681,176 A * | 10/1997 | Ibaraki et al. .............. 439/165 |
| 5,724,683 A * | 3/1998 | Sorimachi et al. ............. 4/248 |
| 5,751,544 A * | 5/1998 | Song .......................... 361/681 |
| 6,275,376 B1 | 8/2001 | Moon ......................... 361/683 |
| 6,447,314 B1 * | 9/2002 | Kato et al. .................. 439/165 |

FOREIGN PATENT DOCUMENTS

| | | |
|---|---|---|
| CN | 1251927 A | 5/2000 |
| JP | 53-157684 | 12/1978 |
| JP | 10-126943 | 5/1998 |
| JP | 11-163986 | 6/1999 |
| JP | 2001-169166 | 6/2001 |
| JP | 2003-133764 | 5/2003 |

\* cited by examiner

*Primary Examiner*—Tuan T. Dinh
(74) *Attorney, Agent, or Firm*—Lee, Hong, Degerman, Kang & Schmadeka

(57) ABSTRACT

An electric device having a first body unit and a second body unit connected through a hinge unit is provided. A Flexible Printed Circuit (FPC) having coil portions wrappable around the shafts of the hinge unit is also provided so that when the second body unit pivots or rotates in relation to the first body unit, the FPC's length is automatically adjusted by way of the coil portions coiling and uncoiling about the shafts.

20 Claims, 10 Drawing Sheets

ROTATABLE HINGE MECHANISM WITH ENCLOSURE FOR HOUSING FLEXIBLE PRINTED CIRCUIT

CROSS-REFERENCE TO RELATED APPLICATIONS

Pursuant to 35 U.S.C. § 119(a), this application claims the benefit of earlier filing date and right of priority to the Korean Application No. 2001-71478, filed on Nov. 16, 2001, entitled "FPC CONNECTING STRUCTURE FOR ELECTRIC EQUIPMENT AND FPC THEREOF" the content of which is hereby incorporated by reference herein in its entirety.

BACKGROUND OF THE INVENTION

1. Field of the Invention

The present invention relates to a connector mechanism and, particularly to, a hinge mechanism for rotatably connecting a display screen to the body of an electric device, the hinge mechanism including an enclosure for housing an electrical medium for electrically connecting the display screen and the electric device.

2. Description of the Background Art

Some electric equipment such as digital cameras include a display panel that pivots about an axis to an open and a closed position. A certain folding type portable phone has been also developed and marketed that includes a foldable display panel that pivots about an axis. Pivoting the display away from the body of the phone, and toward it in the opposite direction, respectively provide for the open and closed positions.

A Flexible Printed Circuit (FPC) can be used in a digital camera and a portable phone to connect a power or video source to a display panel. The FPC electrically connects a main board in the body of the equipment with the display panel through a hinge mechanism. The hinge mechanism connects the body and the display unit.

Most of the currently utilized hinge mechanisms allow for the bi-directional movement of the display panel about a single axis, only. What is needed is a connecting mechanism that allows the display panel to pivot and rotate in multiple directions. Also needed is a durable FPC connecting structure wherein the FPC structure does not limit the movement of the display panel or signal transmission.

FIGS. 1 through 5 illustrate a FPC connecting structure according to conventional art as used in digital cameras. FIGS. 1 and 2 are respective planar front and side views of a FPC connecting structure of a digital camera when the display panel is in a closed position. FIGS. 3 and 4 are respective top and side views of a FPC connecting structure of the digital camera of FIG. 1 when the display panel is in an open position. FIGS. 5A through 5C are respective top, front and side views of a hinge mechanism installed on a digital camera by a third angle projection method.

Referring to FIGS. 1 and 2, a display unit 20 is connected to the body 10 through a hinge 30. The display unit 20 may rotate in a counter clockwise direction to an open position, away from body 10. From the open position, the display panel 20 may rotate in a clockwise direction to a closed position, as shown in FIG. 2.

Hinge coupling portions 12 are mounted on body unit 10 with a hinge cover 31 installed between the hinge coupling portions 12. The display unit 20 is positioned below the hinge cover 31, as shown.

A hinge assembly 33 is housed inside the hinge cover 31. Hinge assembly 33 comprises a first hinge shaft 35 coupled to the body 10 via coupling portion 12. A second hinge shaft 37 is connected and extends outwardly from the hinge assembly 33 and is coupled to the display unit 20.

The first hinge shaft 35 allows the display unit 20 to pivot about a first axis (X) away and toward the body unit 10. The second hinge shaft 37 allows the display unit 20 to rotate around only if the display unit 20 is sufficiently removed from the body unit 10 in an open position.

Referring to FIG. 2, a main board 15 is enclosed in the body 10. A display panel 25, such as Liquid Crystal Display (LCD) or a Plasma Display Panel (PDP), for displaying character or image information according to a video signal transmitted from the main board 15 is enclosed in the display unit 20.

A FPC 40 electrically connects the main board 15 and the display panel 25 to allow for the transmission of electric power and image signals. The FPC 40 is partially housed inside of the hinge cover 31. Connectors 41 and 42 disposed on two opposite ends of the FPC 40 are connected to the main board 15 and to the display panel 25 respectively. An intermediate part of the FPC 40 is flexibly extended from the main board 15 of the display unit 10 to reach inside the hinge cover 31, and thereafter extends toward the second hinge shaft 37 to connect to the display panel 25.

A part 40a of the FPC 40 housed in the body unit 10 is connected so as to have a predetermined marginal length when the display unit 20 is opened, and a part 40b is wrapped around the second hinge shaft 37 so that the display unit 20 can be rotated without restriction. That is, part 40 is wrapped or unwrapped around the second hinge shaft 37, as the display unit 20 rotates, allowing uninterrupted movement of the display unit 20 and safeguarding the FPC 40 from damage.

Referring to FIGS. 2 and 4, a rounded portion 13 provides sufficient pivoting space for the display unit 20 within the cavity 13a formed in body 10. Referring to FIG. 1, a bracket 39 connects the hinge assembly 30 to the display unit 20.

Unfortunately, in the conventional FPC connecting structure described above, when a user opens the display unit 20 away from the body unit 10 more than a predetermined angle, a part 40c positioned between parts 40a and 40b of the FPC 40 is exposed as shown in FIG. 4. This exposed part 40c is aesthetically undesirable. In addition, the FPC 40 can be easily damaged in an open position, due to this exposure. Such damage can degrade image quality and data transfer between main board 15 and display 25.

Also, external particles can enter the body unit 10 through cavity 13a. Sealing the cavity 13a to prevent the entering of particles can adversely affect the smooth or range of operation of the hinge assembly 30. As such, a hinge assembly is needed that can address the above-described shortcomings.

SUMMARY OF THE INVENTION

A double-shaft hinge mechanism with enclosure for housing a FPC for connecting a display panel to the body of an electric equipment is provided.

Additional advantages, objects, and features of the invention will be set forth in the description which follows and, in part, will become apparent to those having ordinary skill in the art upon examination of the following or from practice of the invention. The objectives and other advantages of the invention may be realized and attained by the structure particularly pointed out in the written description and claims hereof as well as the accompanying drawings.

In accordance with one aspect of the present invention, a Flexible Printed Circuit (FPC) connecting structure comprises a hinge unit for connecting a first body unit and a second body unit. The hinge unit comprises first and second ends; a first shaft; a second shaft, and a housing. The second body unit is pivotable about the first shaft toward and away from the first body unit. The second body unit is also rotatable about the second shaft when the second body unit is pivoted away from the first body unit at a first angle.

The connecting structure may further comprise a Flexible Printed Circuit (FPC) having an elongated portion, at least partially enclosed within said housing. Said elongated portion comprises first and second ends, the first end connected to a first electric component included in the first body unit and the second end connected to a second electric component included in the second body unit; and one or more coil portions wrappable around at least one of the first and second shafts of the hinge unit so that when the second body unit pivots or rotates about the first or the second shaft, respectively, said one or more coil portions uncoil to provide an extended length to the elongated portion of the FPC enclosed in the housing.

In accordance with another embodiment of the invention, a FPC connecting structure comprises a first connector connected to an electric component of a first body unit; a first extended portion extended from the first connector and a first coil portion extending from the first extended portion and wrappable around a first shaft connecting the first body unit and a hinge unit. The FPC connecting structure may further comprise a second extended portion extended from the first coil portion and passing through the inside of the hinge unit and a second coil portion extending from the second extended portion and wrappable around a second shaft connecting the hinge unit and the second body unit. The FPC connecting structure may further comprise a third extended portion extended from the second coil portion and a second connector enclosed in an electric component of the first body unit, and electrically connected to the third extended portion.

It is to be understood that both the foregoing summary and the following detailed description of the invention include exemplary embodiments that are intended to provide further explanation of the invention. The content and the embodiments included in the summary and other parts of the application, however, are provided by way of example and should not be construed to limit the scope of the invention as claimed.

BRIEF DESCRIPTION OF THE DRAWINGS

The accompanying drawings are included to provide a further understanding of the invention and are incorporated in and constitute a part of this specification. These drawings illustrate embodiments of the invention and together with the description serve to explain the principles of the invention.

FIGS. 5, 5A, 5B and 5C respectively illustrate planar top, front and side views of a hinge assembly installed on a digital camera having a conventional FPC connecting structure by a third angle projection method;

Features, elements, and aspects of the invention that are referenced by the same numerals in different figures represent the same, equivalent, or similar features, elements, or aspects in accordance with one or more embodiments.

Reference will now be made in detail to one or more embodiments of the invention, examples of which are illustrated in the accompanying drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
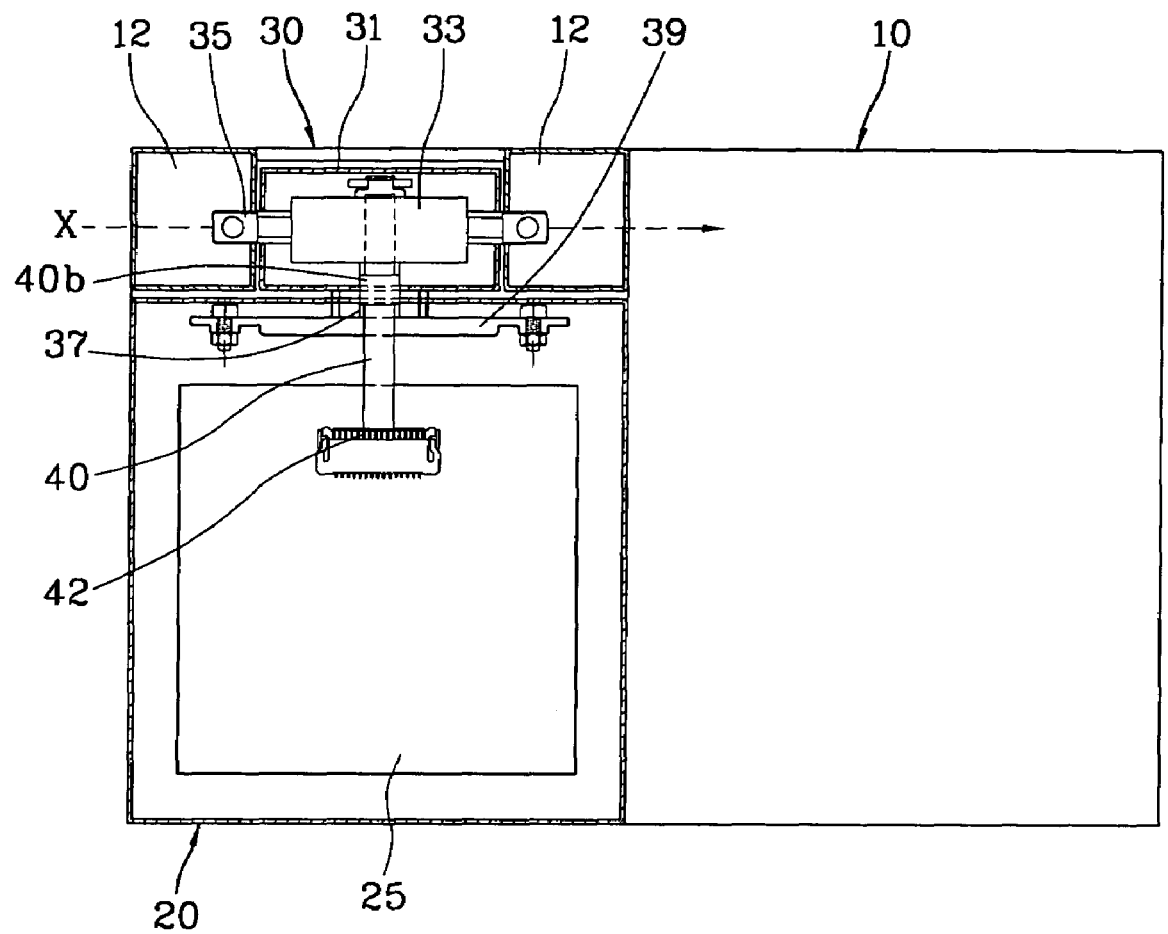
FIG. 1 is a planar front view of a conventional digital camera having a display panel in a closed position.
Figure 2:
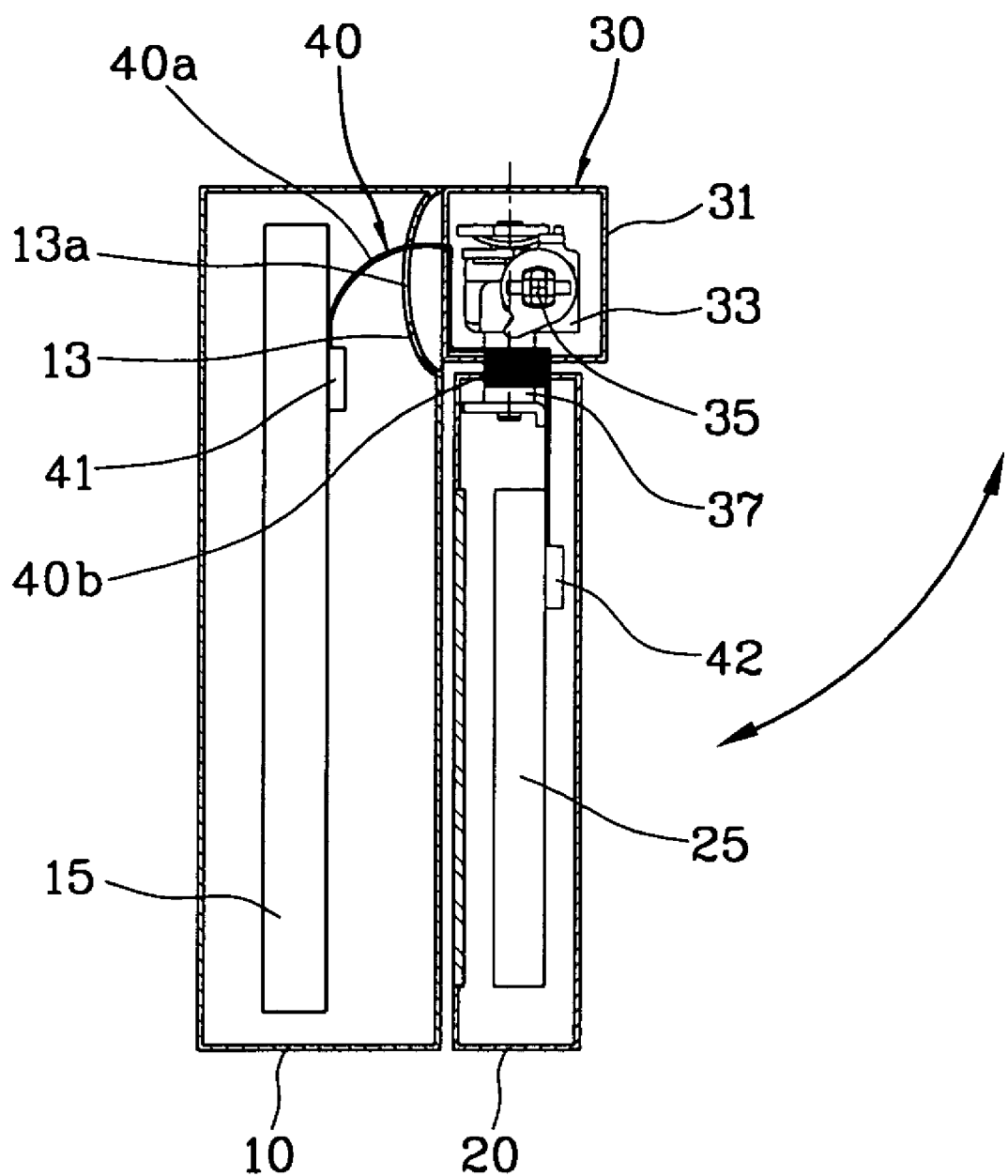
FIG. 2 is a planar side view of the digital camera of FIG. 1.
Figure 3:
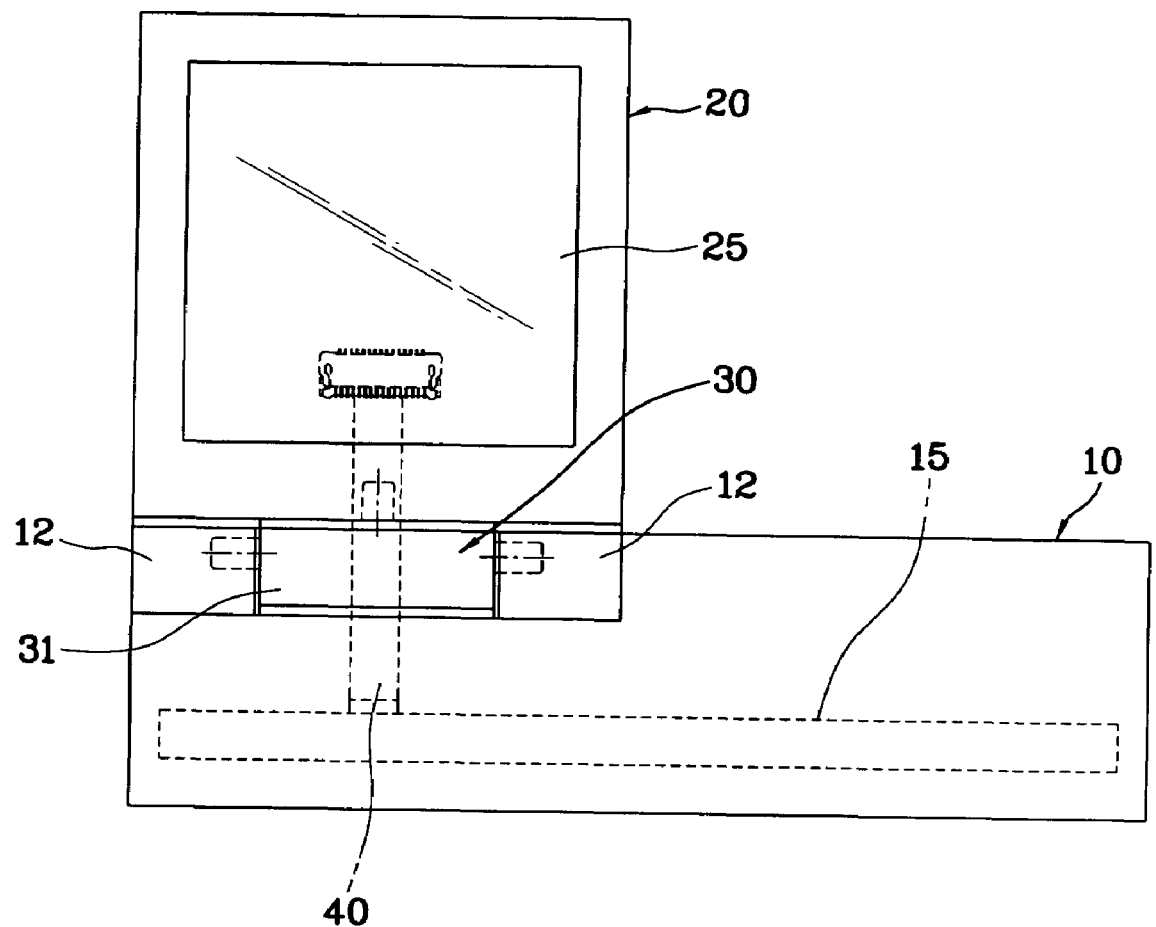
FIG. 3 is a planar top view of the digital camera of FIG. 1 with the display unit in an open position.
Figure 4:
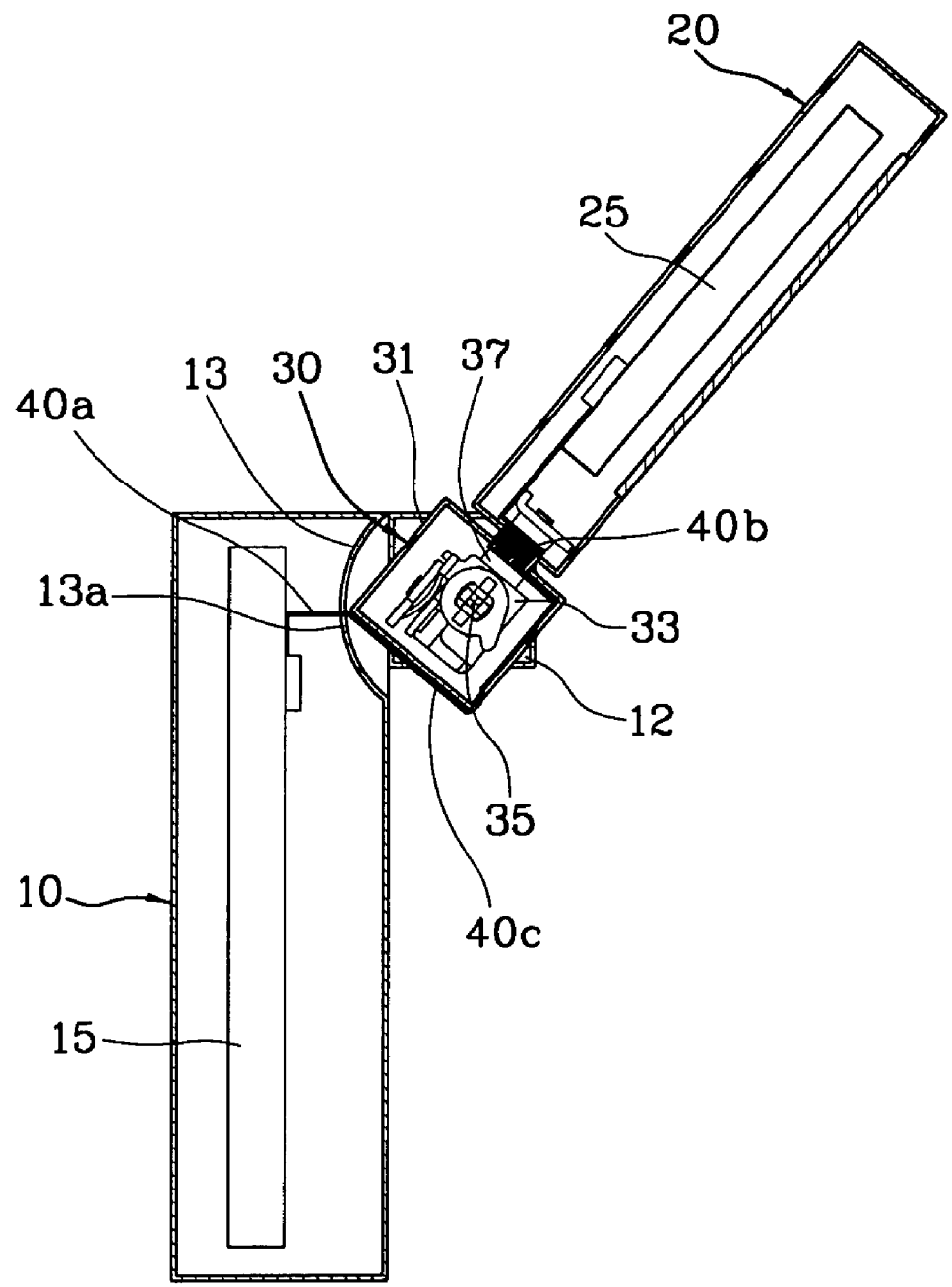
FIG. 4 is a planar side view the digital camera of FIG. 3.
Figure 5A:
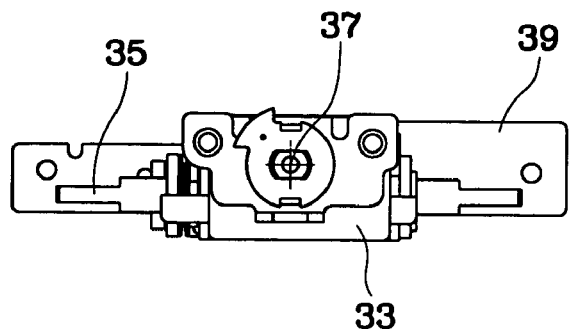
Figure 5B:
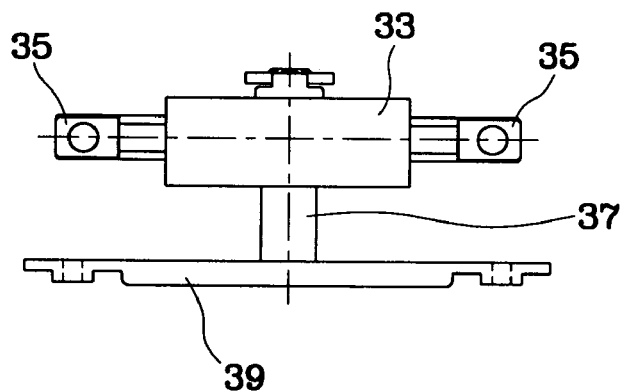
Figure 5C:
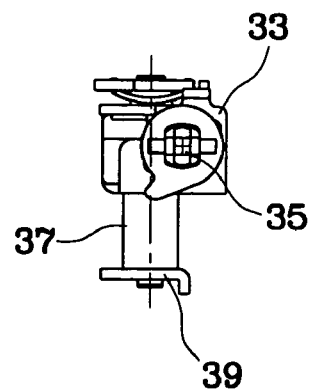
Figure 6:
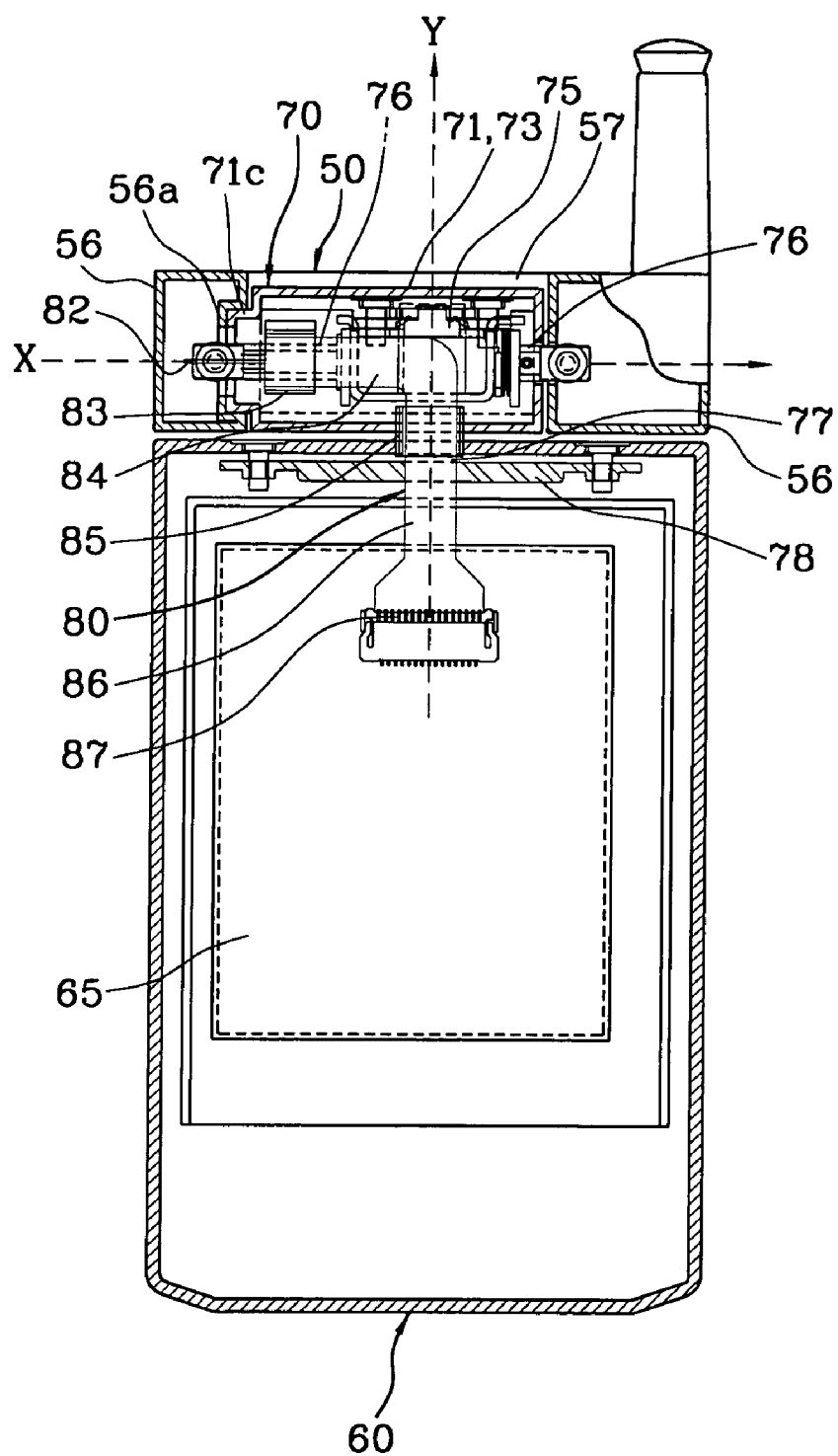
FIG. 6 is a front cross-sectional view of a portable terminal including a FPC connecting structure according to one embodiment of the invention.
Figure 7:
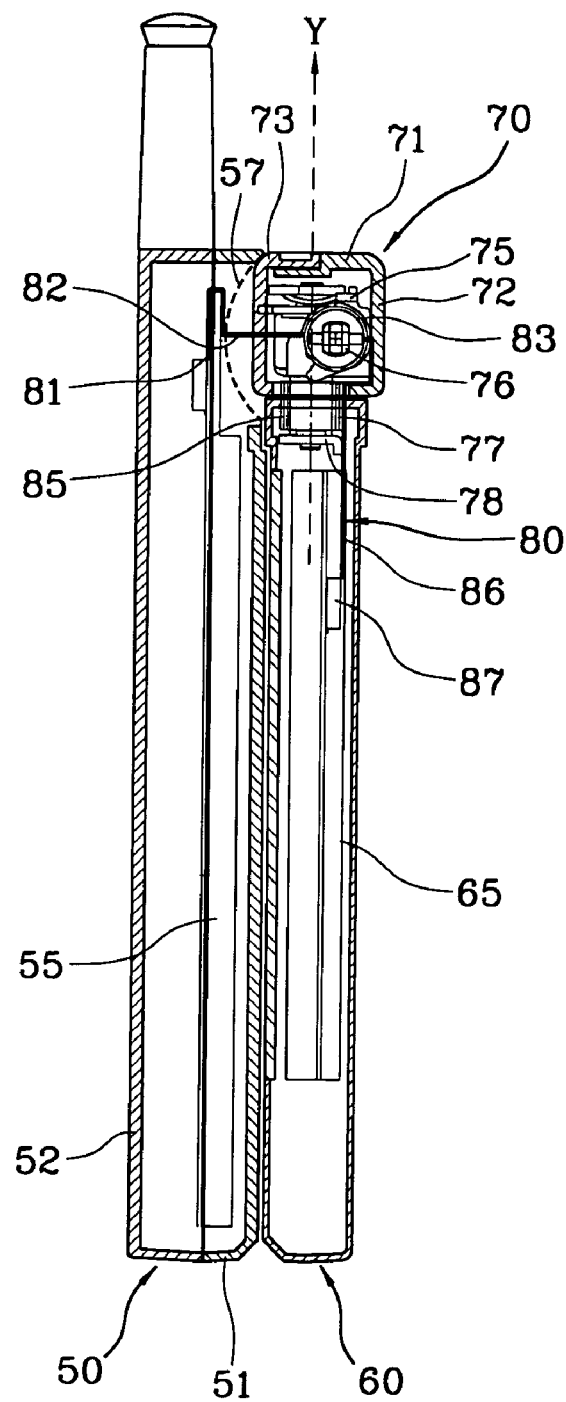
FIG. 7 is a side cross-sectional view of the portable terminal of FIG. 6.
Figure 8:
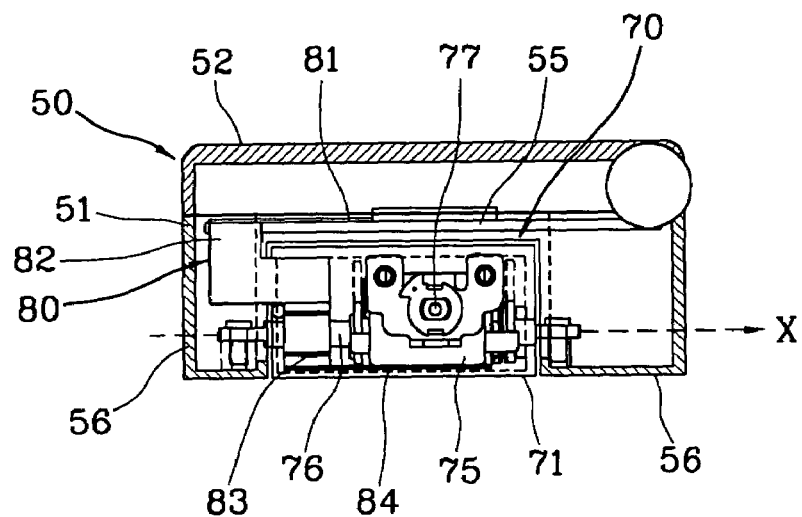
FIG. 8 is a top cross-sectional view of the portable terminal of FIG. 6.

A Flexible Printed Circuit (FPC) connecting structure according to the present invention may be utilized in a portable terminal and other electric devices requiring a FPC connecting structure. FIGS. 6, 7, and 8 illustrate a portable terminal, having a connecting FPC structure and a hinge unit.

Accordingly, the portable terminal in one or more embodiments comprises a body unit 50 including a main board 55; a display unit 60 including a display panel 65; a hinge unit 70 connecting the body unit 50 and the display unit 60 so that the display unit 60 can pivot around an axis "X" toward or away from the body unit 50.

In certain embodiments, hinge unit 70 is designed such that the display unit 60 can also rotate about an axis "Y", when the display unit 60 is opened at a predetermined angle from the body unit 50. FPC 80 electrically connects the main board 55 and the display panel 65. FPC 80 passes through the hinge unit 70 to connect power and signal sources to display panel 65.

The body unit 50 is assembled from an upper case 51 and a lower case 52, and the main board 55 is mounted inside the body unit 50 as shown in FIGS. 7 and 8. A plurality of key buttons are installed and exposed on a front surface of the upper case 51 to allow a user to control the portable terminal. Hinge coupling portions 56 extend forward from two ends of the front surface of upper case 51 so that both ends of the hinge unit 70 can be coupled in-between the hinge coupling portions 56.

A rounded concaved surface 57, for example, is formed on the top surface of the upper case 51, opposite to the hinge coupling portions 56 to allow for the unobstructed rotation of the display unit 60 about the X axis. The display unit 60 displays various image and message information transmitted from the main board 55 through the FPC 80, and can pivot about the X axis towards or away from the body unit 50, respectively in clockwise or counter clockwise directions, by way of hinge unit 70. Furthermore, the display unit 60 can rotate about the Y axis to allow a user to control the rotation angle of the display unit 60 in an open position. As such, the hinge unit 70 connects the display unit 60 to the body unit 50 so that the display unit 60 can both pivot and rotate about respective X and Y axes.

In accordance with one aspect of the invention, the hinge unit 70 comprises: a hinge cover 71 disposed between the hinge coupling portions 56; a hinge assembly 75 housed in the hinge cover 71; a first hinge shaft 76 having opposite ends, each of which protruding from the hinge cover 71 to engage coupling portions 56 so that the display unit 60 can pivot about the X axis; and a second hinge shaft 77 positioned approximately perpendicular to the first hinge shaft 76 and coupled to the display unit 60 so that the display unit 60 can rotate about the Y axis. As such, in one or more embodiments, the hinge unit 70 is constructed to have a double-shaft structure. The hinge assembly 75 is disposed in the hinge cover 71.

Figure 9:
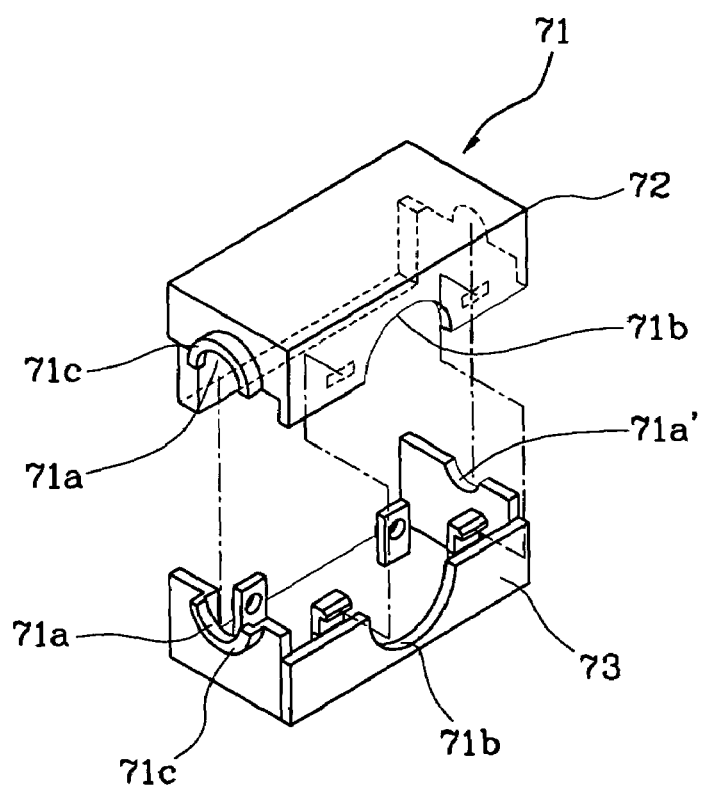
FIG. 9 is an exploded perspective view of a hinge cover in a hinge unit according to one embodiment of the invention.

As shown in FIG. 9, the hinge cover 71 is configured to receive the first hinge shaft 76 and the second hinge shaft 77. The hinge cover 71 is assembled from an upper cover 72, a lower cover 73, first hinge openings 71a and 71a' and a second hinge opening 71b formed by coupling semicircular grooves, as shown. Said openings on the side surfaces and the front surface of the upper cover 72 and the lower cover 73 are formed to receive the first hinge shaft 76 and the second hinge shaft 77.

In accordance with one aspect of the invention, one of the first hinge opening 71a where the first hinge shaft 76 is received is expanded so that the FPC 80 can easily pass through. Also, a raised tubular collar portion 71c for insertion into the hinge coupling portion 56 of the body unit 50 is formed around the first hinge opening 71a. Referring to FIG. 6, a groove portion 56a is formed on the hinge coupling portion 56 so that the portion 71c can be inserted therein.

Figure 10:
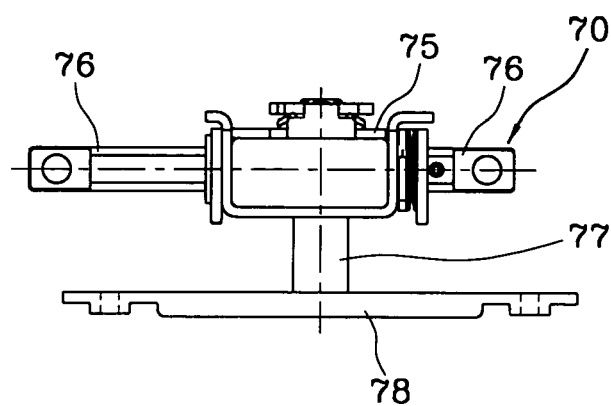
FIG. 10 is a front view of a hinge assembly according to one embodiment of the invention.

The portion 71c and the groove portion 56a function as covering means for preventing the FPC 80 from being exposed when the FPC 80 passes through the first hinge opening 71a. The hinge assembly 75 includes an elastic means for controlling the rotation state of the hinge. The first hinge shaft 76 and the second hinge shaft 77 are connected so as to rotate freely, as shown in FIG. 10.

One end of the first hinge shaft 76 through which the FPC 80 passes (left side in FIG. 10) is longer than the other end to allow the FPC 80 to wrap around the longer end when a user rotates the display unit 60. In one embodiment, a bracket 78 is secured to the display unit 60 by a screw, for example, on one side, and is connected to an end of the second hinge shaft 77, on the other side.

An intermediate part of the FPC 80 passes through the inner side of the hinge cover 70 as shown in FIG. 7. Pivotable and rotatable portions 83 and 85, respectively comprise the first hinge shaft 76 and the second hinge shaft 77 enclosed in the hinge cover 71.

Figure 11:
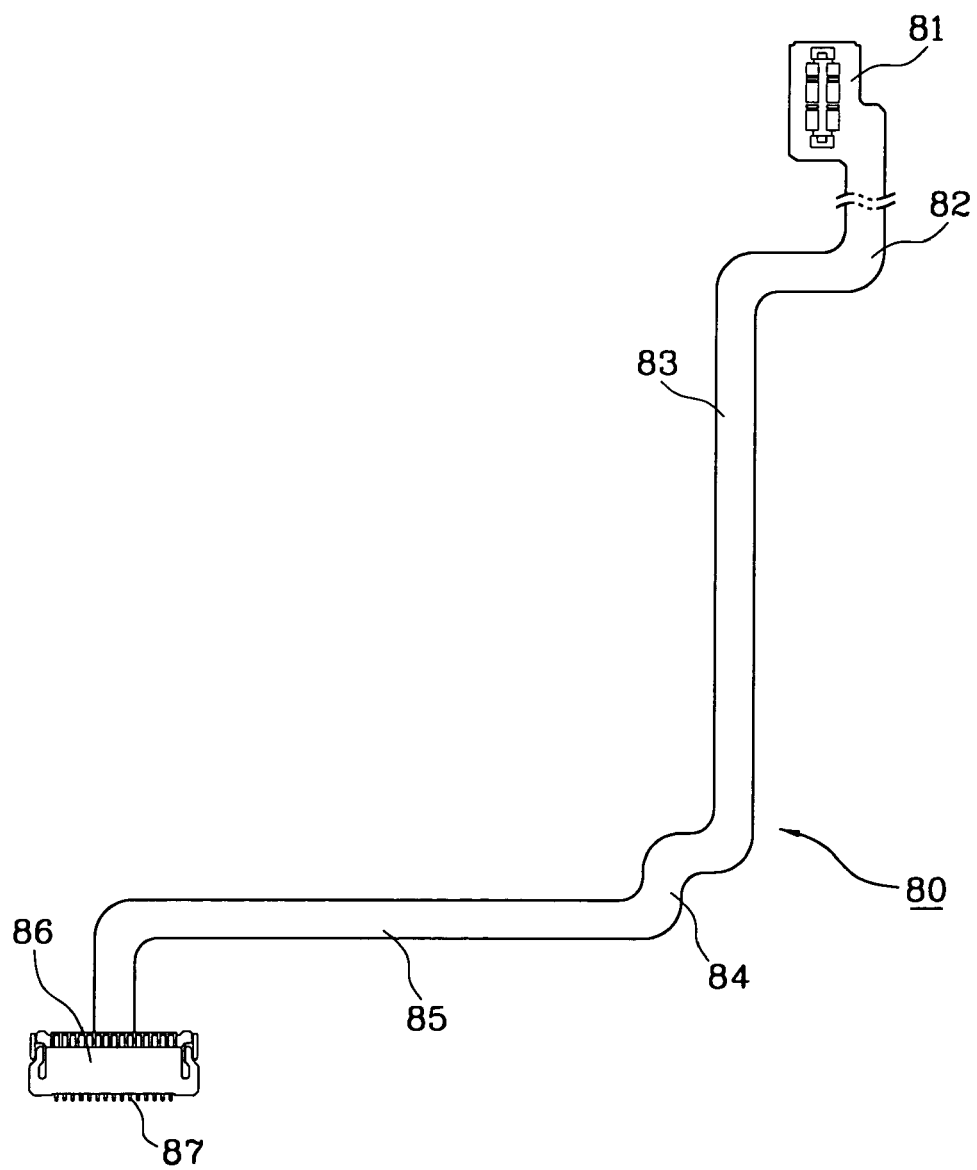
FIG. 11 is a schematic diagram of a FPC according to one embodiment of the present invention.
Figure 12:
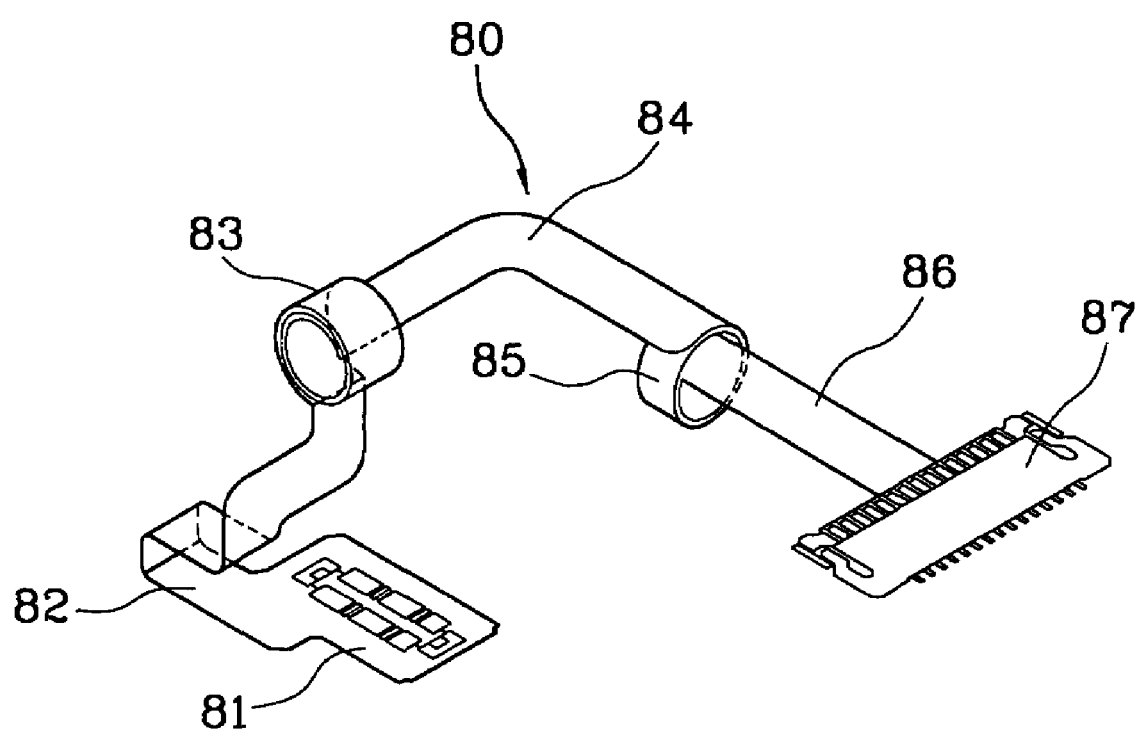
FIG. 12 is a perspective operational illustration of the FPC of FIG. 11, according to one embodiment of the invention.

Referring to FIGS. 11 and 12, in accordance with one aspect of the invention, the FPC 80 comprises: a first connector 81 electrically connected to the main board 55; a first extended portion 82 extending from the first connector 81 and passing through the inside of the hinge coupling portion 56; a first coil portion 83 extending from the first extended portion 82, and wrappable around first hinge shaft 76; a second extended portion 84 extending from the first coil portion 83 for passing through the inside of the hinge cover 71; a second coil portion 85 extending from the second extended portion 84, wrappable around the second hinge shaft 77; a third extended portion 86 extending from the second coil portion 85; and a second connector 87 electrically connected to an end of the third extended portion 86 and coupled to the display panel 65.

The first coil portion 83 and the second coil portion 85 function to provide additional length to the FPC 80 by way of uncoiling when the display unit 60 pivots and rotates about the X and Y axes, respectively. When the display unit 60 is pivoted or rotated in the opposite direction, then the FPC 80's length is shortened as the first and second coil portions 83 and 85 recoil (i.e., wrap) around first and second hinge shafts 76 and 77, respectively.

The length and the various properties of the first, second, and third extended portions 82, 84, and 86 and coil portions 83 and 85 may be determined according to designing condition of the electric equipment, and may be implemented differently in other embodiments of the invention.

In a preferred embodiment the bent features of the respective extended portions of the FPC 80 are formed at approximately right angles, and it is desirable that the lengths of the first coil portion 83 and the second coil portion 85 are sufficiently long to allow for the first and second coil portions 83 and 85 to respectively wrap around the first hinge shaft 76 and the second hinge shaft 77 at least twice.

In some embodiments, the second connector 87 connects to the display panel 65 after passing through the hinge coupling portion 56 and the hinge cover 71 where the first connector 81 is connected to the main board 55. The FPC 80 includes the first coil portion 83 and the second coil portion 85 which can wrap around the first hinge shaft 76 and the second hinge shaft 77, respectively. Accordingly, the movement of the display unit 60 is not restrained by the FPC 80. Further, the FPC 80 is completely enclosed in the hinge cover 81 and protected against external hazards that can possibly damage the FPC or the quality of data transmission through it.

Referring back to FIGS. 7 and 8, the first connector 81 is connected to, for example, the rear surface of the main board 55 wherein the first extended portion 82 is bent in shape of an inverted "U" over the upper part of the main board 55 and vertically risen over the inner side of the hinge coupling portion 56.

The first extended portion 82 of the FPC 80 is extended through the inside of the hinge cover 71, the first hinge hole 71a and through the inside of the hinge coupling portion 56. The first coil portion 83 is wrapped around the first hinge shaft 76. The second extended portion 84 bends over an upper part of the hinge unit 75, and the second coil portion 85 wraps around the second hinge shaft 77. The third extended portion 86 extends to the inside of the display unit 60 through the second hinge opening 71b. The second connector 87 is coupled to the display panel 65. As such, the main board 55 and the display panel 76 are connected electrically to each other via the FPC 80.

When the user opens the display unit 60 in order to use the terminal, the display unit 60 and the hinge unit 70 rotate around the first hinge shaft 76. At that time, the first coil portion 83 of the FPC 80 wraps around the first hinge shaft 76 as the display unit 60 pivots around the X axis.

If the display unit 60 is rotated about the Y axis by the user when the display unit 60 is in an open position, the second coil portion 85 of the FPC 80 is wrapped around the second hinge shaft 77. Depending on implementation, the coil portions 83 and 85 may unwrap instead of wrapping around the hinge shafts as described as the display unit rotates and pivots about the X and Y axes.

The FPC connecting structure of the invention is described here as applicable to a portable terminal by way of example. The FPC connecting structure, however, can be applied to other electric equipment such as digital cameras or the like. Thus, this exemplary application should not be construed as limiting the scope of the invention as claimed.

Where an electric device has a first body unit and a second body unit connected through a hinge unit, the FPC of the present invention having coil portions wrappable around the shaft of the hinge unit can be employed so that when the second body unit pivots or rotates in relation to the first body unit, the FPC's length can be automatically adjusted by way of the coil portions coiling and uncoiling about the shaft.

In accordance with one embodiment, a FPC applied to an electric device comprises: a first connector connected to an electric component of a first body unit; a first extended portion extended from the first connector; a first coil portion extending from the first extended portion, and wrappable around a first shaft connecting the first body unit and a hinge unit; a second extended portion extended from the first coil portion and passing through the inside of the hinge unit; a second coil portion extending from the second extended portion, and wrappable around a second shaft connecting the hinge unit and the second body unit; a third extended portion extended from the second coil portion; and a second connector enclosed in an electric component of the first body unit, and electrically connected to the third extended portion.

Accordingly, the FPC connecting structure of the invention is protected against damage and exposure to foreign elements. The aesthetic appearance of the equipment is also improved and the operational reliability is increased. As such a hinge mechanism including an enclosure for housing a FPC is provided.

Although particular embodiments of the invention have been shown and described, it will be apparent to those skilled in the art that changes and modifications may be made without departing from the invention in its broader aspects, and therefore, the appended claims are to encompass within their scope all such changes and modifications that fall within the true scope of the invention.

What is claimed is:

1. A portable terminal comprising:
a body unit having an antenna and at least one hinge coupling portion;
a display unit having a display panel; and
a hinge unit disposed between the body unit and the display unit, and configured to couple the display unit allowing the display unit to rotate around an X-axis and a Y-axis with respect to the body unit, the Y-axis substantially perpendicular to the X-axis, wherein the hinge unit comprising:
a first hinge shaft pivotally coupled to the at least one hinge coupling portion around the X-axis;
a second hinge shaft pivotally coupled to the display unit around the Y-axis; and
a hinge cover enclosing the first hinge shaft and second hinge shaft,
wherein the first hinge shaft and second hinge shaft bisect each other, and the second hinge shaft does not bisect the first hinge shaft at a midpoint of the first hinge shaft,
wherein the hinge unit is formed asymmetrically from the second hinge shaft.

2. The portable terminal of claim 1, wherein the hinge cover comprising:
an upper cover,
a lower cover, and
first and second hinge openings formed on the side surfaces and the front surface of the upper cover and the lower cover for receiving the first hinge shaft and the second hinge shaft, respectively.

3. The portable terminal of claim 2, wherein at least the first hinge opening is expanded so that a FPC can easily pass through.

4. The portable terminal of claim 3, comprising a raised tubular collar portion formed around the first hinge opening for insertion into the at least one hinge coupling portion of the body unit.

5. The portable terminal of claim 4, wherein the at least one hinge coupling portion comprises a groove portion for receiving the raised tubular collar portion.

6. The portable terminal of claim 5, wherein the raised tubular collar portion and the groove portion in conjunction function as a covering means to prevent the FPC from exposure when the FPC passes through the first hinge opening.

7. The portable terminal of claim 6, wherein the hinge assembly includes an elastic means for controlling the rotation state of the hinge unit.

8. The portable terminal of claim 6, wherein the first hinge shaft has first and second ends, and wherein the first end of the first hinge shaft is longer than the second end.

9. The portable terminal of claim 6, wherein the first and second hinge shafts each have first and second ends, and wherein the FPC wraps around the first end of the first hinge shaft and the first end of the second hinge shaft.

10. The portable terminal of claim 8, wherein the FPC wraps around the second end of the first hinge shaft when the display unit pivots about the X-axis.

11. A portable terminal comprising:
a body unit having an antenna and at least one hinge coupling portion;
a display unit having a display panel; and
a hinge unit disposed between the body unit and the display unit, and configured to couple the display unit allowing the display unit to rotate around an X-axis and a Y-axis with respect to the body unit, the Y-axis substantially perpendicular to the X-axis, wherein the hinge unit comprising:
a first hinge shaft pivotally coupled to the at least one hinge coupling portion around the X-axis;
a second hinge shaft pivotally coupled to the display unit around the Y-axis; and
a hinge cover enclosing the first hinge shaft and second hinge shaft,
wherein the first hinge shaft and second hinge shaft bisect each other, and the second hinge shaft does not bisect the first hinge shaft at a midpoint of the first hinge shaft.

12. The portable terminal of claim 11, wherein the hinge cover comprising:
an upper cover,
a lower cover, and
first and second hinge openings formed on the side surfaces and the front surface of the upper cover and the lower cover for receiving the first hinge shaft and the second hinge shaft, respectively.

13. The portable terminal of claim 12, wherein at least the first hinge opening is expanded so that a FPC can easily pass through.

14. The portable terminal of claim 13, comprising a raised tubular collar portion formed around the first hinge opening for insertion into the at least one hinge coupling portion of the body unit.

15. The portable terminal of claim 14, wherein the at least one hinge coupling portion comprises a groove portion for receiving the raised tubular collar portion.

16. The portable terminal of claim 15, wherein the raised tubular collar portion and the groove portion in conjunction function as a covering means to prevent the FPC from exposure when the FPC passes through the first hinge opening.

17. The portable terminal of claim 16, wherein the hinge assembly includes an elastic means for controlling the rotation state of the hinge unit.

18. The portable terminal of claim 16, wherein the first hinge shaft has first and second ends, and wherein the first end of the first hinge shaft is longer than the second end.

19. The portable terminal of claim 16, wherein the first and second hinge shafts each have first and second ends, and wherein the FPC wraps around the first end of the first hinge shaft and the first end of the second hinge shaft.

20. The portable terminal of claim 18, wherein the FPC wraps around the second end of the first hinge shaft when the display unit pivots about the X-axis.

* * * * *